(12) United States Patent
Kikuchi

(10) Patent No.: US 6,226,202 B1
(45) Date of Patent: *May 1, 2001

(54) FLASH MEMORY CARD INCLUDING CIS INFORMATION

(75) Inventor: Shuichi Kikuchi, Esashi (JP)

(73) Assignee: Tokyo Electron Device Limited, Yokohama (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 12 days.

(21) Appl. No.: 09/233,099

(22) Filed: Jan. 19, 1999

Related U.S. Application Data

(63) Continuation of application No. PCT/JP97/02464, filed on Jul. 16, 1997.

(30) Foreign Application Priority Data

Jul. 19, 1996 (JP) .................................................... 8-207656

(51) Int. Cl.[7] .................................................. G11C 16/04
(52) U.S. Cl. .................. 365/185.33; 365/52; 365/185.12
(58) Field of Search .......................... 365/51, 52, 185.33, 365/195

(56) References Cited

U.S. PATENT DOCUMENTS

| | | | | |
|---|---|---|---|---|
| 5,388,248 | * | 2/1995 | Robinson et al. | 395/425 |
| 5,459,850 | * | 10/1995 | Clay et al. | 395/497.02 |
| 5,485,595 | * | 1/1996 | Assar et al. | 395/430 |
| 5,532,945 | | 7/1996 | Robinson | 364/707 |
| 5,628,028 | * | 5/1997 | Michelson | 395/828 |
| 5,734,816 | * | 3/1998 | Niijima et al. | 714/8 |
| 5,754,567 | * | 5/1998 | Norman | 371/40.18 |
| 5,845,332 | * | 12/1998 | Inoue et al. | 711/163 |
| 5,978,862 | * | 11/1999 | Kou et al. | 710/14 |
| 6,085,268 | * | 7/2000 | Lee et al. | 710/72 |

FOREIGN PATENT DOCUMENTS 07296132   11/1995   (JP) .

* cited by examiner

*Primary Examiner*—David Nelms
*Assistant Examiner*—Gene N. Auduong
(74) *Attorney, Agent, or Firm*—Pillsbury Madison & Sutro LLP

(57) ABSTRACT

A flash memory card includes one or a plurality of flash memories and a controller having an interface connected to a host computer to store card attribute information to be presented to the host computer at a predetermined storage position in the flash memory.

19 Claims, 13 Drawing Sheets

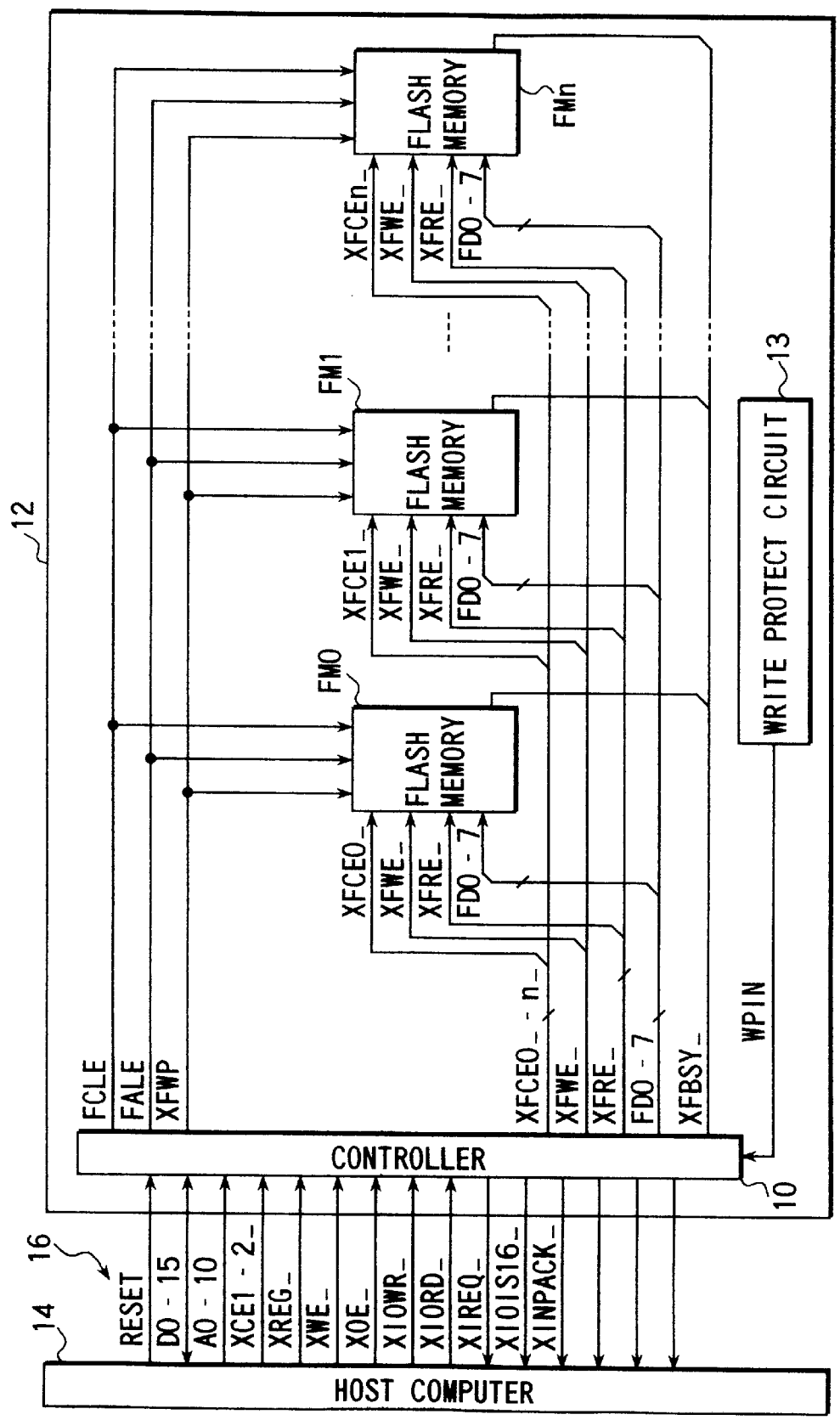
F I G. 1

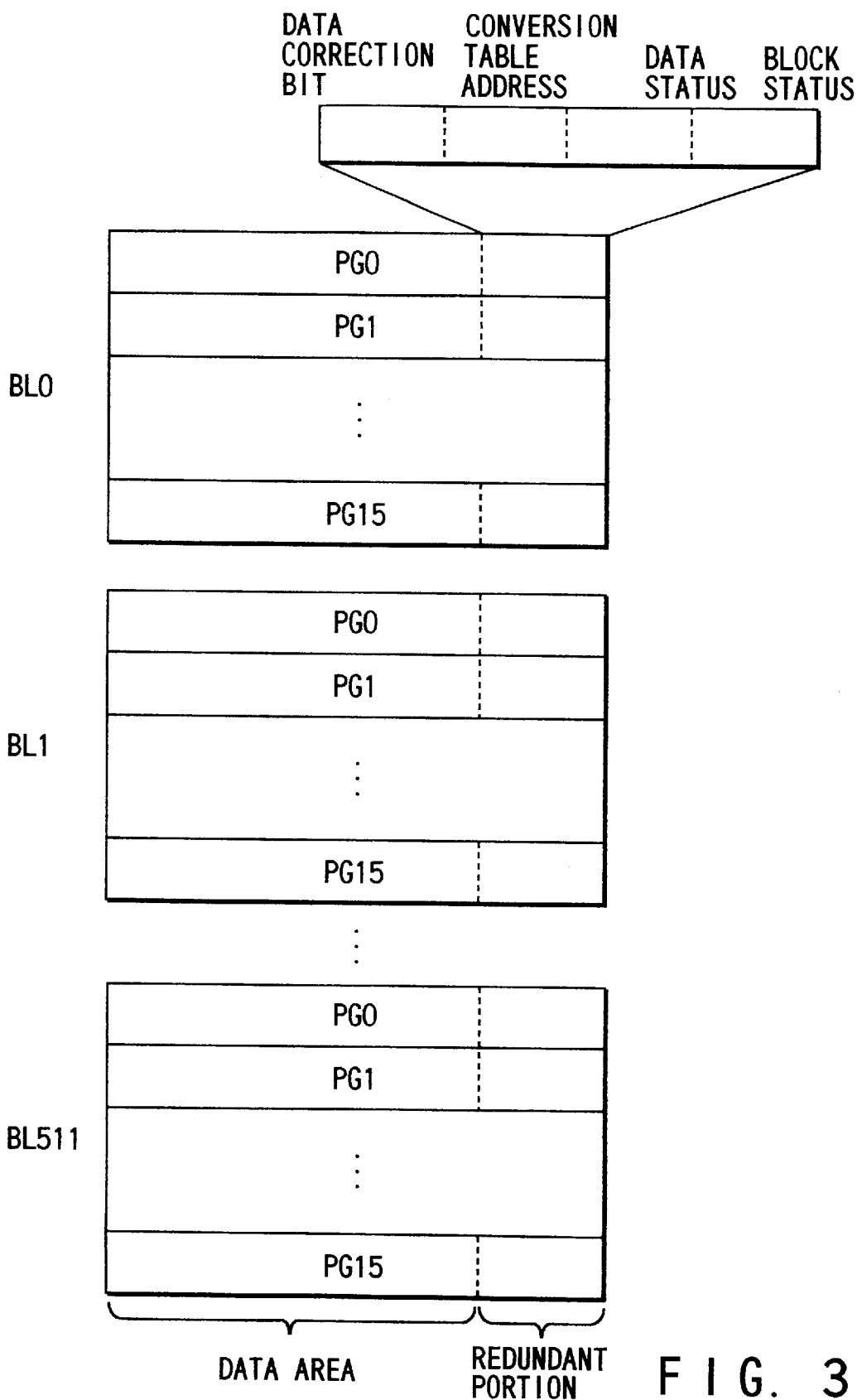
F I G. 3

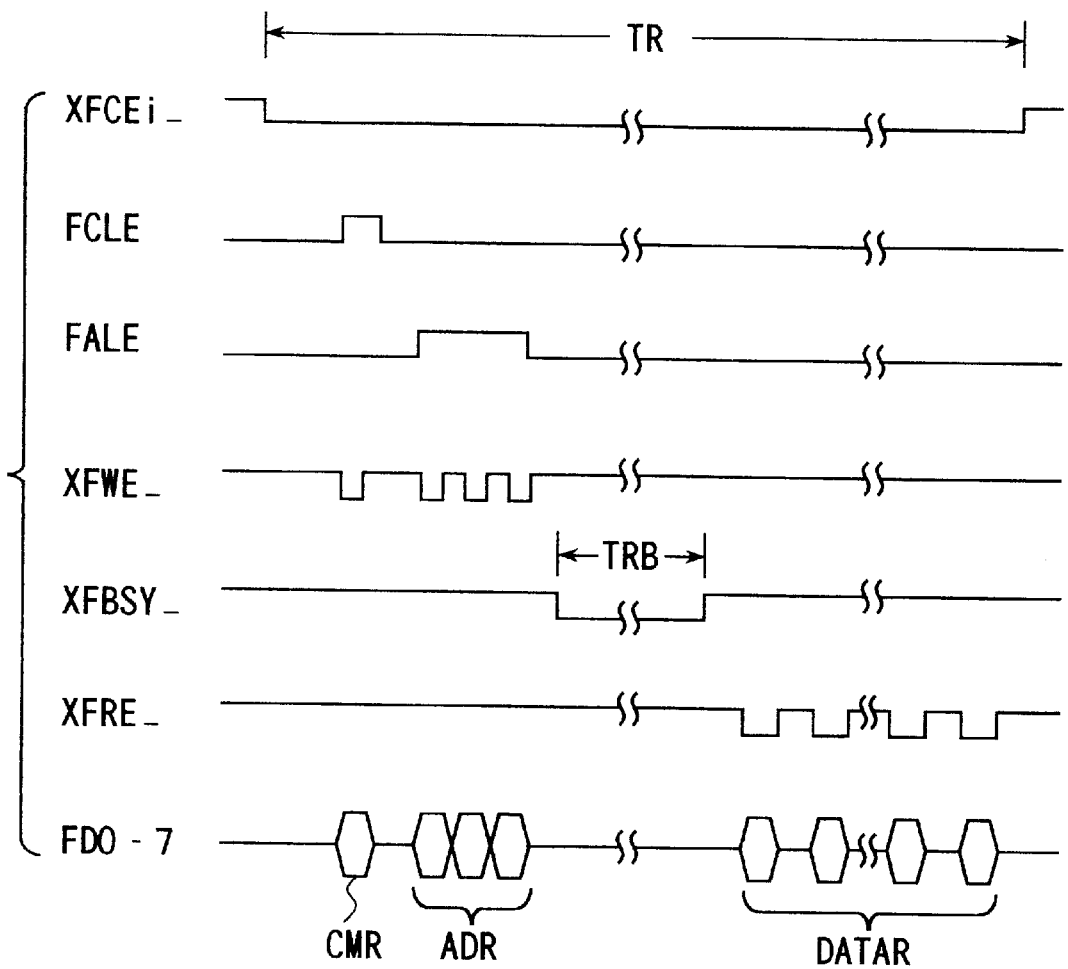
F I G. 6

(CIS INFORMATION)

| ADDR | DATA | CONTENTS | |
|------|------|----------|---|
| 00 | 01h | TUPLE ID (DEVICE INFORMATION TUPLE) | |
| 02 | 03h | POINTER INDICATING NEXT TUPLE | |
| 04 | D9h | TYPE: I/O; SPEED: 250 ns | |
| 06 | 01h | DEVICE SIZE: 2 Kbytes | |
| 08 | FFh | END OF DEVICE INFORMATION TUPLE | |
| 0A | 18h | TUPLE ID (JEDEC DEVICE INFORMATION) | |
| 0C | 02h | POINTER INDICATING NEXT TUPLE | |
| 0E | DFh | JEDEC MAKER ID | |
| 10 | 01h | JEDEC DEVICE ID (NO VPP REQUIRED) | |
| 12 | 20h | TUPLE ID (MANUFACTURE INFORMATION) | |
| 14 | 04h | POINTER INDICATING NEXT TUPLE | |
| ⋮ | | | |
| B2 | 20h | PRODUCT MAKER INFORMATION | " " |
| B4 | 20h | PRODUCT MAKER INFORMATION | " " |
| B6 | 20h | PRODUCT MAKER INFORMATION | " " |
| B8 | 20h | PRODUCT MAKER INFORMATION | " " |
| BA | 20h | PRODUCT MAKER INFORMATION | " " |
| BC | 20h | PRODUCT MAKER INFORMATION | " " |
| BE | 20h | PRODUCT MAKER INFORMATION | " " |
| C0 | 00h | END OF PRODUCT MAKER INFORMATION | |
| C2 | 20h | PRODUCT NAME INFORMATION | " " |
| C4 | 20h | PRODUCT NAME INFORMATION | " " |
| C6 | 20h | PRODUCT NAME INFORMATION | " " |
| C8 | 20h | PRODUCT NAME INFORMATION | " " |
| CA | 00h | END OF PRODUCT NAME INFORMATION | |
| CC | 30h | PRODUCT VERSION INFORMATION | "0" |
| CE | 2Eh | PRODUCT VERSION INFORMATION | "." |
| D0 | 30h | PRODUCT VERSION INFORMATION | "0" |
| D2 | 00h | END OF PRODUCT VERSION INFORMATION | |
| D4 | FFh | END OF PRODUCT INFORMATION TUPLE | |
| D6 | 14h | NO LINK TUPLE ID | |
| D8 | 00h | POINTER INDICATING NEXT TUPLE | |
| DA | FFh | CHAIN END TUPLE | |
| ⋮ | | | |

FIG. 7

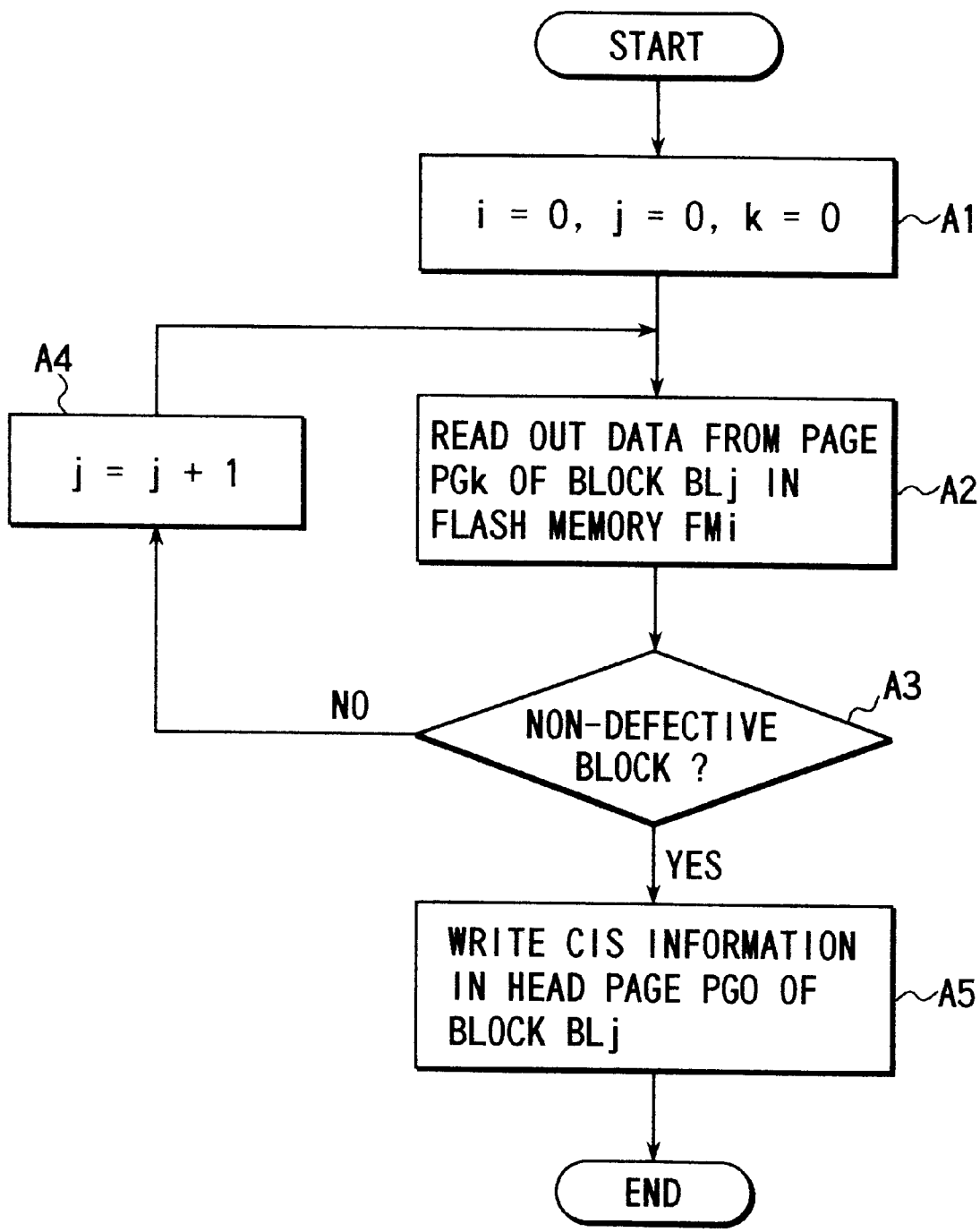
F I G. 8

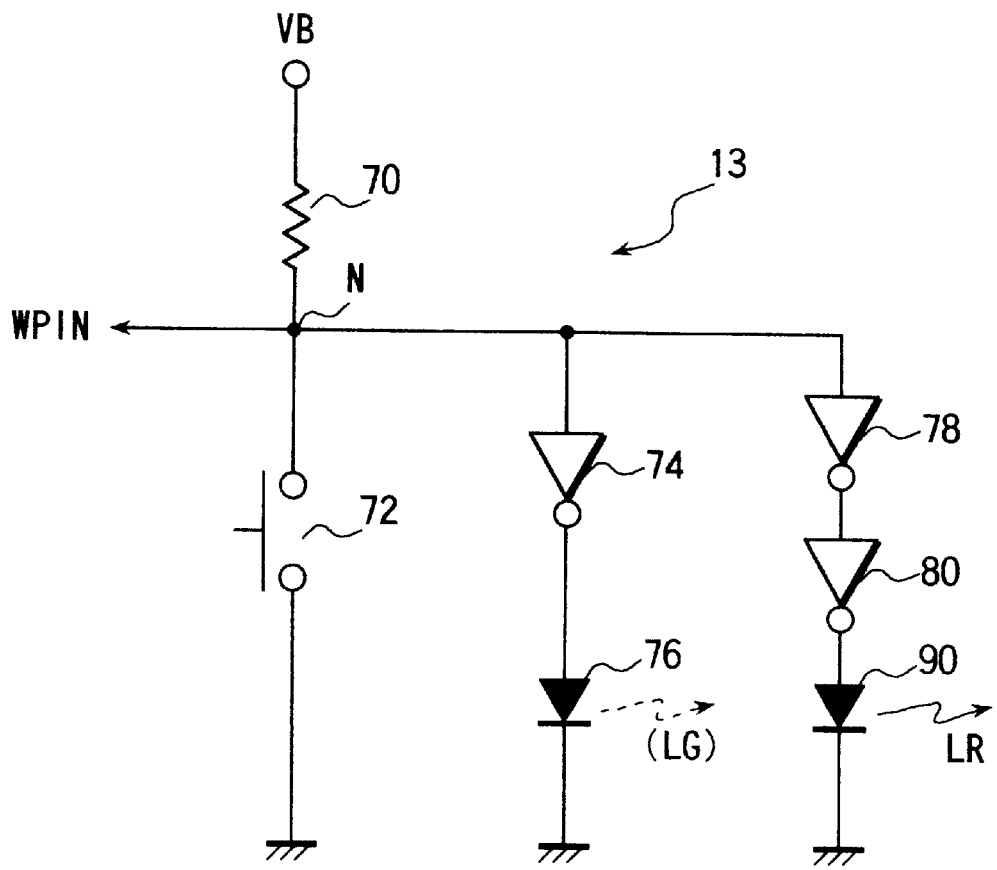
F I G. 11
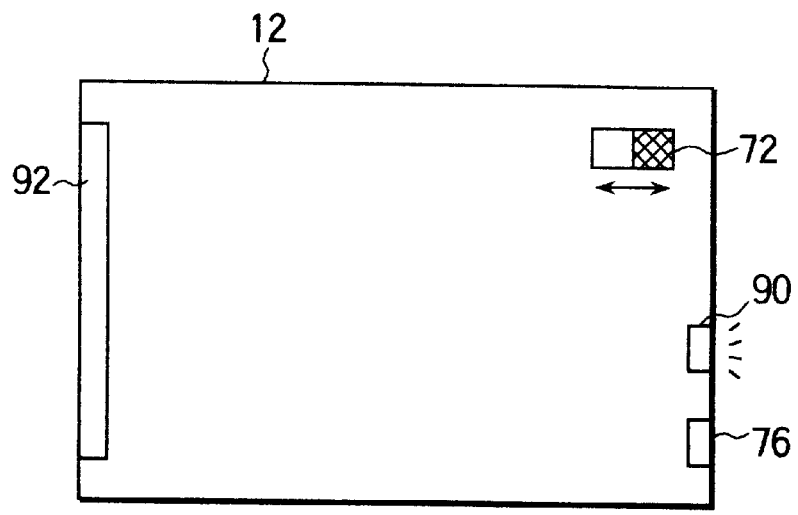
F I G. 12

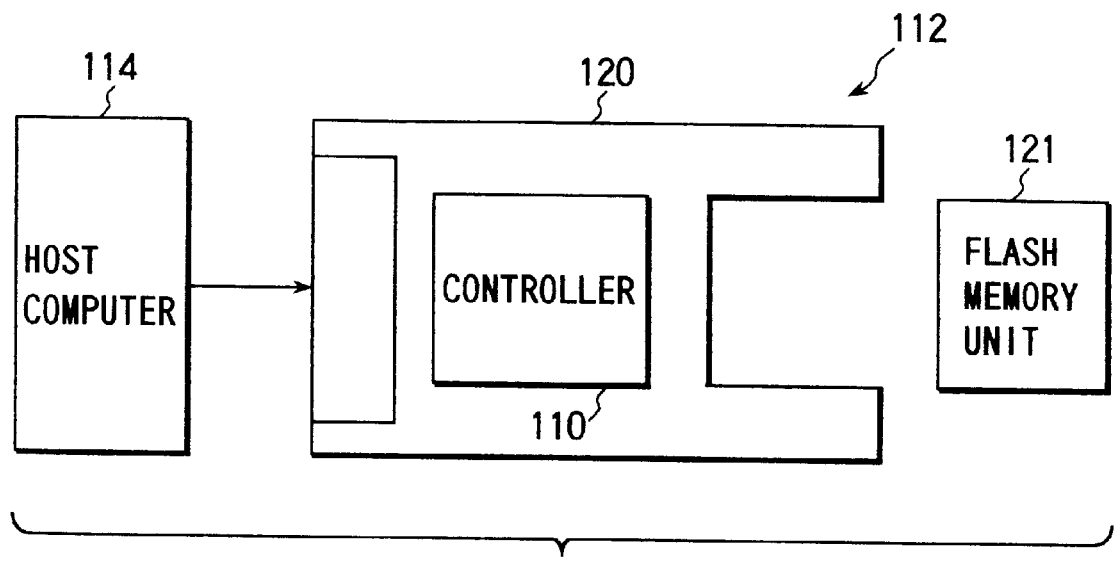
F I G. 15A
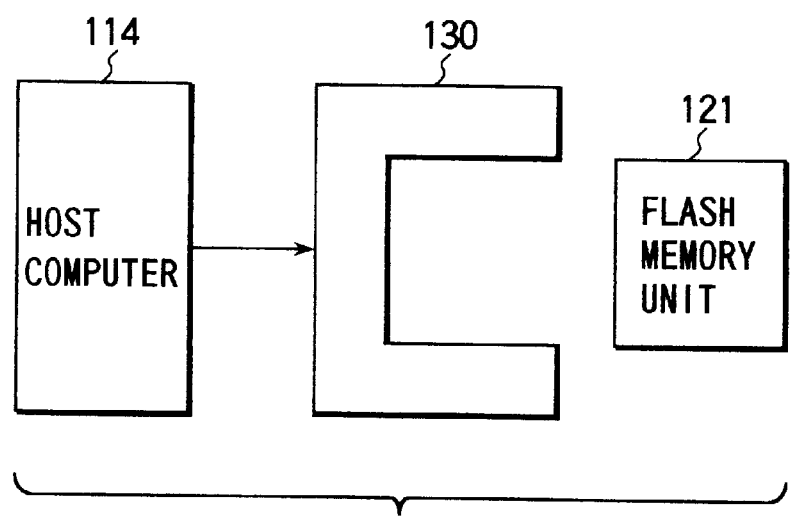
F I G. 15B

FLASH MEMORY CARD INCLUDING CIS INFORMATION

CROSS-REFERENCE TO RELATED APPLICATIONS

This is a Continuation Application of International Patent Application No. PCT/JP97/02464, filed Jul. 16, 1997, the entire contents of which are incorporated herein by reference.

BACKGROUND OF THE INVENTION

The present invention relates to a flash memory card having a flash memory mounted on a card as a memory medium.

Attention has been paid to flash memories (flash EEPROMS) as semiconductor memories that will replace magnetic disks such as hard disks and floppy disks. A flash memory is a nonvolatile, low-power-consumption semiconductor memory which can be electrically reprogrammed. Since these memories are compact, lightweight, and highly resistant to vibrations, the application range of the memories in portable devices and the like extends.

Such flash memories find a typical application in flash memory cards. A flash memory card is a card obtained by mounting one or a plurality of flash memories (IC chips) on one card. This card is generally provided as a PC card complying with PCMCIA.

A PC card needs to have card attribute information referred to as CIS (Card Information Structure) information that displays or describes the configuration of the card, the manner of accessing the card, and the like, owing to the PCMCIA requirements (specifications) that the compatibility of the card should be improved between host computers (e.g., personal computers) complying with the standards.

On a flash memory card of this type, the following components are mounted, in addition to a flash memory: a controller connected to a host system through a predetermined interface to execute data read/write operations with respect to the flash memory on the card; a ROM which holds programs required for the operation of the controller and a RAM for holding data; and the like.

In a conventional flash memory card of this type, CIS information is stored in the ROM on the card, together with other software programs. When the flash memory card is inserted into the card slot of the host system, the host computer searches for the CIS information of this flash memory card. In the flash memory card, the controller reads out the CIS information from the ROM and sets it in the RAM or register that the host computer can directly access. The host computer assigns a memory space, an I/O space area, an interruption level, and the like to the card on the basis of the CIS information loaded from the flash memory card, and sequentially read/write-accesses the flash memory on the card afterward.

In some case, part or all of the CIS information of the flash memory card must be rewritten. When, for example, flash memory cards manufactured by a card maker as a primary supplier are to be distributed as cards provided a card vendor as a secondary supplier, pieces of attribute information such as product maker information, product name information, and product version of the CIS information of each card need to be updated.

In a conventional flash memory card, however, since the CIS information is stored as fixed information in the ROM as described above, it is practically impossible to rewrite the CIS information.

Note that the conventional flash memory card does not have the function of protecting the data stored in the flash memory, i.e., the write protect function of inhibiting new data from being written in the flash memory. For this reason, new data may be overwritten in the flash memory card in which data to be retained is stored. As a result, the important data may be erased.

Further, in a flash memory card wherein a flash memory unit is detachable to an adapter, the contents of CIS must be changed in accordance with the flash memory body.

BRIEF SUMMARY OF THE INVENTION

It is an object of the present invention to provide a flash memory card which allows card attribute information to be arbitrarily rewritten without increasing the number of parts and the cost.

It is another object of the present invention to provide a flash memory card which can reliably retain stored data by preventing an undesired write operation.

According to the first aspect of the present invention, there is provided a flash memory card comprising one or a plurality of flash memories and a controller having an interface connected to a host computer and designed to store card attribute information to be presented to the host computer at a predetermined position in the flash memory.

In the above flash memory card, the storage area of each flash memory is divided into a predetermined number of blocks, and the card attribute information is stored in a normal block having the highest or lowest address rank in the flash memory in which the card attribute information is to be stored.

In addition, in the above flash memory card, each block is divided into a predetermined number of pages. Every time the card attribute information stored in the block is updated partly or totally, new card attribute information is sequentially written in the page having the next address.

Furthermore, in the above flash memory card, pieces of identical card attribute information are redundantly stored at different storage positions in a predetermined flash memory in which the card attribute information is to be stored.

According to the second aspect of the present invention, there is provided a flash memory card comprising one or a plurality of flash memories, an interface which can be connected to a host computer, and a write protect circuit for inhibiting the host computer from writing data in the flash memories.

The flash memory card according to the second aspect further comprises an error processor for detecting and correcting an error in data read out from an arbitrary position in the flash memory in accordance with a read request from the host computer, and a data transfer section for, when an error is detected by the error processor, writing the readout data, corrected by the error processor, in another available storage position regardless of whether the write protect circuit is set in a write disable state.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing the internal circuit arrangement of a flash memory card according to an embodiment of the present invention;

FIG. 3 is a view showing the format of the storage area of a flash memory;

FIG. 6 is a timing chart showing an operation to be performed when the controller reads out data from a given flash memory in the embodiment;

FIG. 7 is a view showing an example of the format of CIS information (part);

FIG. 8 is a flow chart showing processing to be performed by the controller to write (register) the first CIS information in the embodiment;

FIG. 11 is a circuit diagram showing an example of the arrangement of a write protect circuit in the embodiment;

FIG. 12 is a schematic plan view showing a switching unit and a display unit, of the write protect circuit in the embodiment, which can be mounted on an outer side surface of the card;

FIGS. 15A and 15B are views showing flash memory cards in various forms which can be connected to the host computer.

DETAILED DESCRIPTION OF THE INVENTION

Figure 2:
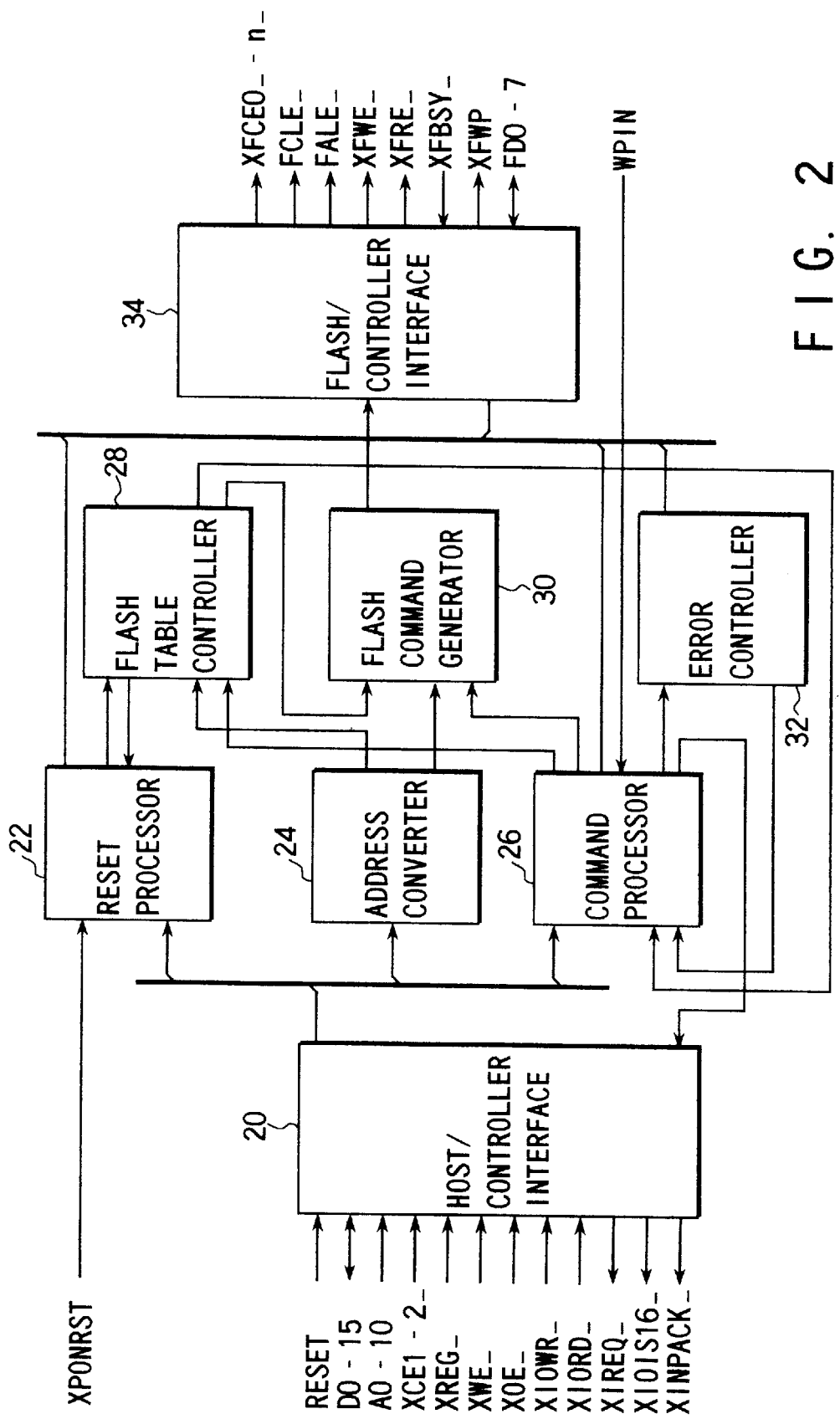
FIG. 2 is a block diagram showing the internal functional arrangement of a controller in the embodiment.

FIG. 1 shows the circuit arrangement of a flash memory card according to an embodiment of the present invention. This flash memory card has a one-chip controller 10, a plurality (n+1) of NAND flash memories FM0 to FMn, and a write protect circuit 13 which are mounted on one card plate 12. When the card plate 12 is inserted into the card slot of a host computer 14, the controller 10 is connected to the host computer 14 through an interface complying with predetermined specifications, e.g., a PCMCIA-ATA or IDE interface 16. The flash memories FM0 to FMn are constituted by memory chips having the same arrangement and function.

The controller 10 is connected to the respective flash memories FM0 to FMn through an 8-bit internal bus FD0-7, control lines FCLE, FALE, XFWP, XFWE-, XFRE-, and XFBSY-, each of which is common to all the flash memories FM0 to FMn, and individual control lines XFCE0- to XFCEn- equal in number (i.e., (n+1)) to the total number of flash memories FM0 to FMn.

The internal bus FD0-7 is used to transmit a command, an address, and data between the controller 10 and the flash memories FM0 to FMn. Of the above common control lines, the control line FCLE is a command latch enable control line which is used to make the flash memories FM0 to FMn identify a command code on the bus FD0-7 as a command. The control line FALE is an address latch enable control line which is used to make the flash memories FM0 to FMn identify an address code on the bus FD0-7 as an address. The control line XFWP is a write protect control line which is used to make the flash memories FM0 to FMn forcibly inhibit write operations. The control line XFWE- is a write enable control line which is used to make each of the flash memories FM0 to FMn receive codes or data on the bus FD0-7. The control line XFRE- is a read (output) enable control line which is used to output data read out from the output port of each of the flash memories FM0 to FMn onto the bus FD0-7. The control line XFBSY- is a busy line which is used to allow the flash memories FM0 to FMn to notify the controller 10 of their busy states.

The above individual control lines XFCE0- to XFCEn- are chip enable control lines which are used to individually or independently set the respective flash memories FM0 to FMn in the chip enable state (operable state).

The write protect circuit 13 supplies a write protect signal WPIN to the controller 10 in accordance with the operation of a manual switch mounted on the card, as will be described later. When the write protect signal WPIN from the write protect circuit 13 is set in the active state (H level), the controller 10 is set in the write protect mode and rejects a write request from the host computer 14.

The controller 10 is constituted by a CPU, a ROM, a RAM, an input/output interface circuit, and the like in terms of hardware.

FIG. 2 is a block diagram showing the functional arrangement of the controller 10. In terms of functions, the controller 10 includes a host/controller interface 20, a reset processor 22, an address converter 24, a command processor 26, a flash table controller 28, a flash command generator 30, an error controller 32, and a flash/controller interface 34.

The host/controller interface 20 incorporates various memories or registers in/from which the host computer 14 directly write/read data, and is connected to the bus of the host computer 14 through an interface complying with predetermined specifications, e.g., a PCMCIA-ATA interface. CIS information exchanged between the host computer 14 and the controller 10 is temporarily stored in a memory or register in the host/controller interface 20.

According to this interface, the host computer 14 uses address signals A0 to A10 and control signals XCE1- to XCE2- to select the respective registers in the host/controller interface 20. A control signal XREG- is used to select the memory space and I/O space of an address map. A control signal XWE-/XOE- is used to write/read data in/from the memory space. A control signal XIOWR-/XIORD- is used to write/read data in/from the I/O space. The host/controller interface 20 outputs an interruption request XIREQ-, an input acknowledge signal XINPACK-, and the like to the host computer 14. The host/controller interface 20 also includes a circuit for decoding a command from the host computer 14.

The reset processor 22 controls a resetting operation for each component of the controller 10 or an initializing operation after a reset releasing operation in response to an external reset signal, e.g., a reset signal XPONRST.

The address converter 24 converts the logical address of a CHS (Cylinder Head Sector) mode designated on the host computer 14 side into the logical address of an LBA (Logical Block Address) mode in the flash memory card.

The command processor 26 controls the respective components of the controller 10 to execute a command supplied from the host computer 14 and decoded by the host/controller interface 20.

The flash table controller 28 initializes an address conversion table and an empty block table in accordance with a request from the reset processor 22 or the command processor 26, and searches or updates the table in accordance with a command from the host computer 14. The flash table controller 28 has a table memory fabricated by an SRAM. An address conversion table and an empty block table are formed on this table memory.

The flash command generator 30 generates command codes and address signals for the flash memories FM0 to FMn in accordance with requests from the flash table controller 28, the command processor 26, and the like.

The error controller 32 generates an ECC (Error Correcting Code) in a write operation, and performs ECC error control in a read operation. The error controller 32 also performs a block substituting process or the like in the event of a failure or error.

The flash/controller interface 34 is an input/output port for exchanging data and signals with each of the flash memories FM0 to FMn through the command bus FD0-7 and various control lines (e.g., the control lines FCLE and FALE), and has a timing control function of multiplexing commands, addresses, and data on the common bus FD0-7 at different timings.

FIG. 3 shows the format of the storage area in each flash memory FMi (i=0−n). The entire storage area of each flash memory FMi is divided into 512 blocks BL0 to BL511. Each block BLj (j=0 to 511) is divided into a plurality (e.g., 16) of pages (or sectors) PG0 to PG15. In general, programming (writing) and reading are performed in units of pages, whereas erasing is performed in units of blocks.

Each page PGk (k=0 to 15) has a data area having a predetermined capacity, e.g., 512 bytes, and a redundant portion having a predetermined capacity, e.g., 16 bytes. The data area is an area for storing data from the host computer. The redundant portion is divided into fields, in which a data correction bit, a conversion table address, a data status, a block status, and the like are respectively stored.

Of these redundant portion data, "data status" includes a flag indicating the state of the corresponding page. In this embodiment, as will be described later, when CIS information is rewritten, an error flag is set in "data status" of the redundant portion of the page in which the old CIS information is stored. A block quality flag is set in "block status". The block quality flag indicates whether the block belonging to the corresponding page is determined as a non-defective (normal) block by a block quality check performed before the shipment of the chip.

Figure 4:
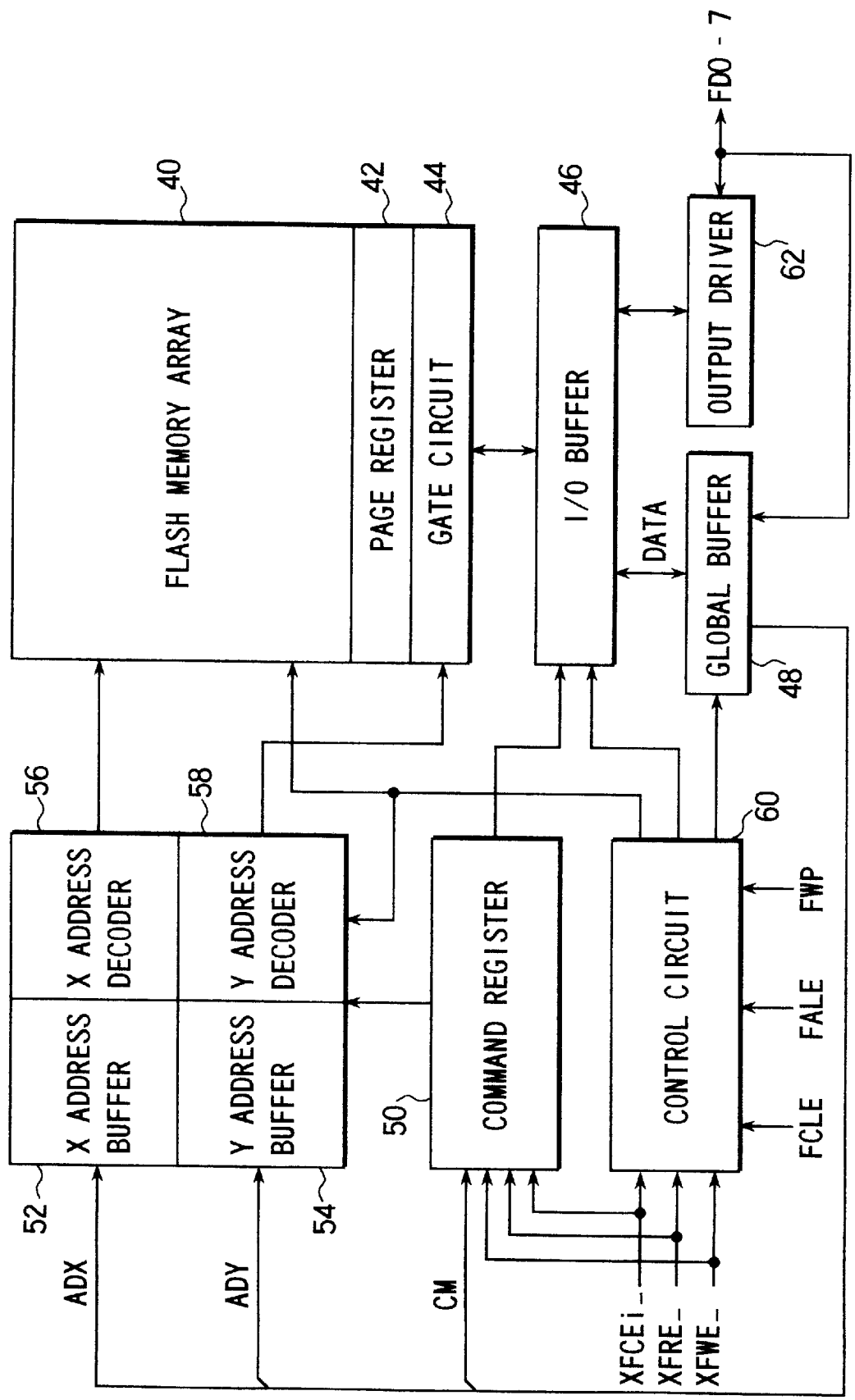
FIG. 4 is a block diagram showing an example of the internal arrangement of each flash memory in the embodiment.

FIG. 4 shows the internal arrangement of each flash memory FMi. A flash memory array 40 is constituted by many memory cells arranged in a matrix form. Assume that the one-chip flash memory FMi has 512 blocks BL0 to BL511, each block BLj has 16 pages PG0 to PG15, and each page PGk has a 512-byte data area and a 16-byte redundant portion, as shown in FIG. 3. In this case, the flash memory array 40 is constituted by 8,192 (16×512) (rows)×528 (512+16) (columns) memory cells, and has a storage capacity of 32 megabytes.

The flash memory array 40 is electrically connected to an I/O buffer 46 having a storage capacity corresponding to one page (528 bytes) through a page register 42 and a gate circuit 44. With this arrangement, parallel data transfer is performed between the flash memory array 40 and the I/O buffer 46 in units of one page. In this flash memory FMi, the I/O buffer 46 substantially serves as an output port.

A command, an address, and data on the bus FD0-7 are respectively latched in a command register 50, X and Y address buffers 52 and 54, and the I/O buffer 46 through a global buffer 48.

The command register 50 decodes the input commands and controls the address buffers 52 and 54, address decoders 56 and 58, and the I/O buffer 46. The command register 50 includes a status register for holding status information indicating the internal state of the memory.

The X address buffer 52 receives a row address ADX. The X address decoder 56 decodes this row address ADX and activates the designated (selected) row (page) in the flash memory array 40. The Y address buffer 54 receives a column address ADY. The Y address decoder 58 decodes this column address ADY and controls the gate circuit 44 to transfer the data on the designated (selected) column in the flash memory array 40.

A control circuit 60 receives control signals FCLE, FALE, FWP, XFCEi-, XFWE-, and XFRE- from the controller 10, and controls the respective components of the memory in accordance with the control signals. An output driver 62 drives a bus line to output readout data set on the I/0 buffer 46 to the bus FD0-7.

Figure 5:
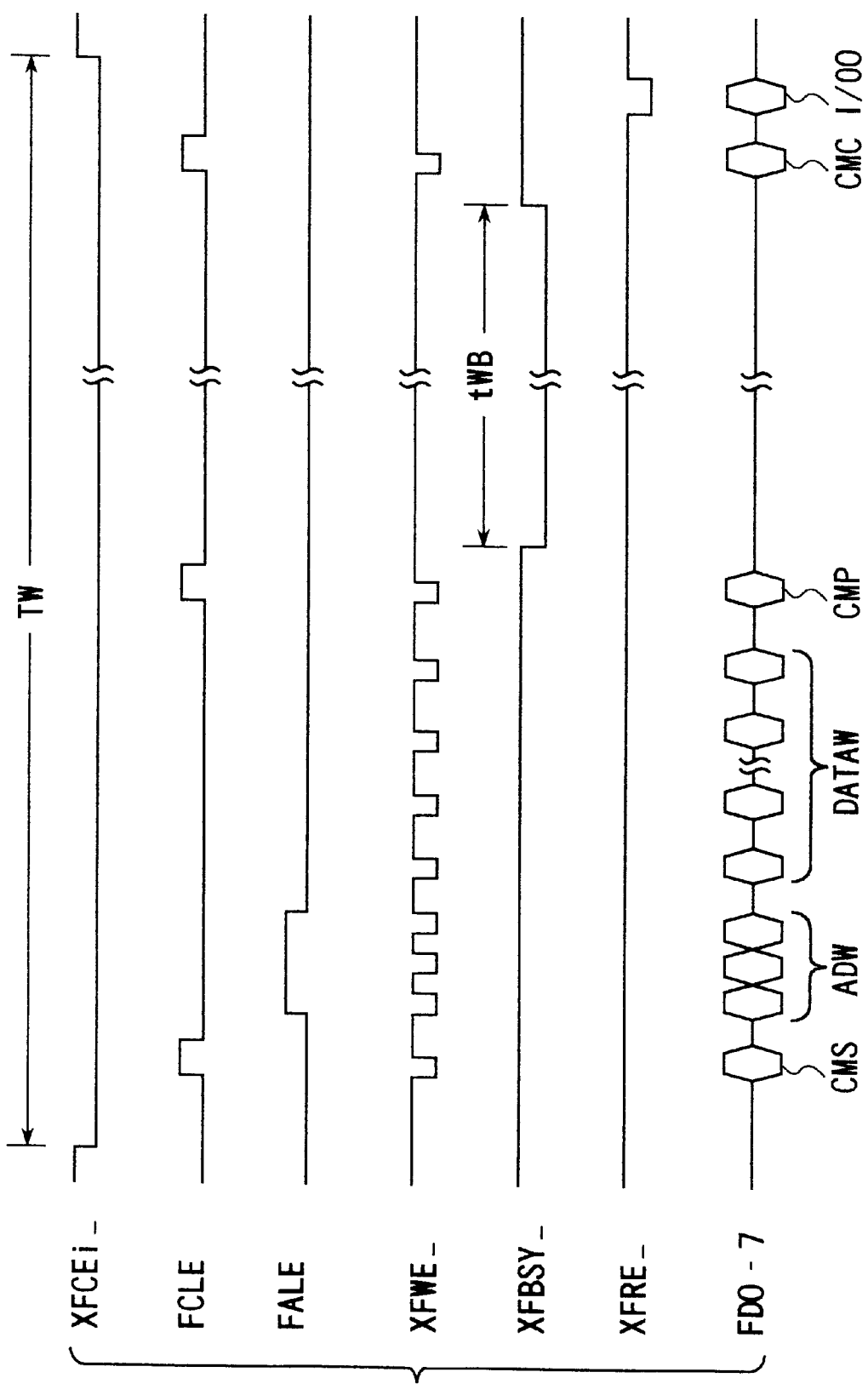
FIG. 5 is a timing chart showing an operation to be performed when the controller writes data in a given flash memory in the embodiment.
Figure 9:
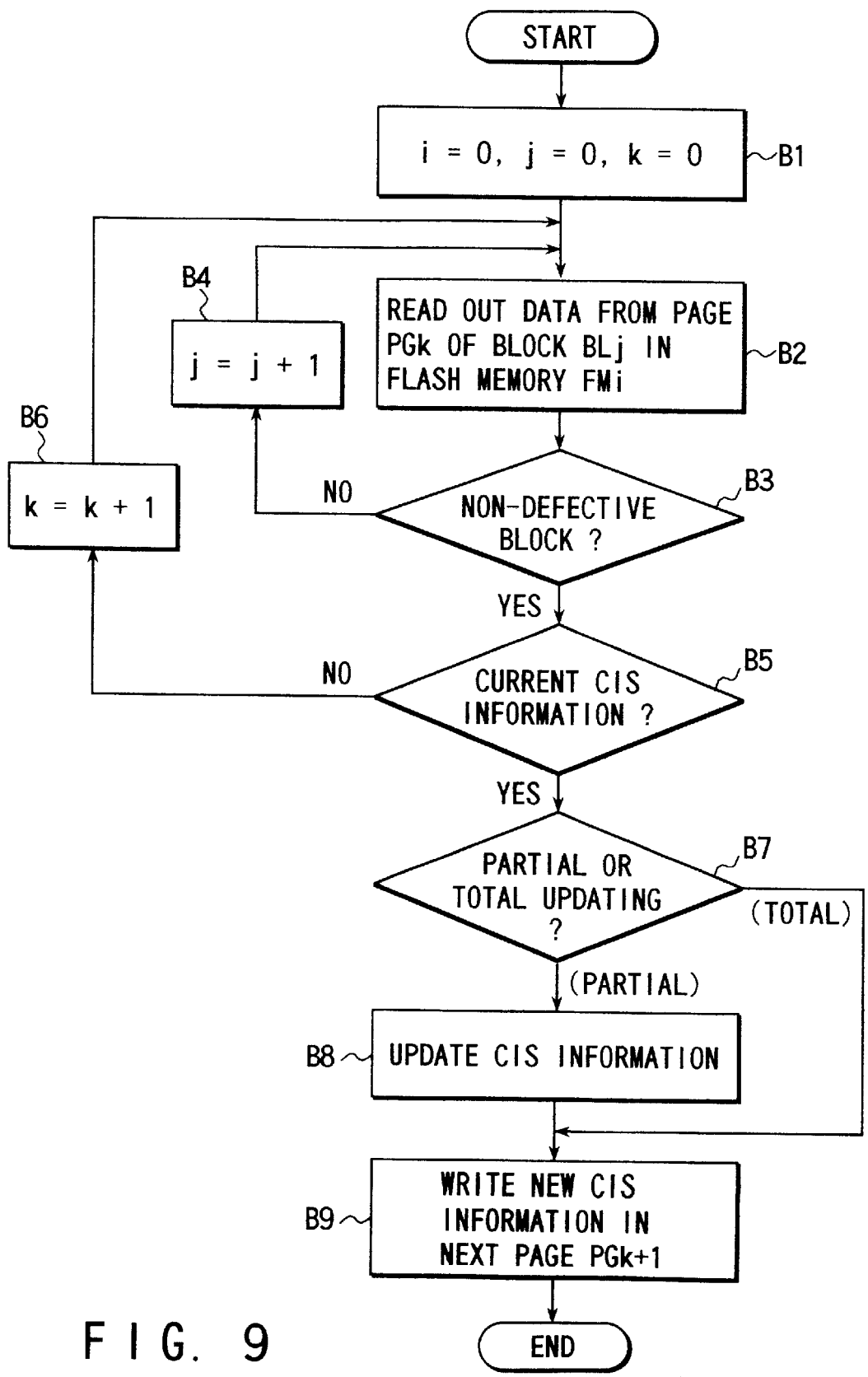
FIG. 9 is a flow chart showing processing to be performed by the controller to rewrite (update) CIS information in the embodiment.

An operation to be performed when the controller 10 writes data in an arbitrary flash memory FMi (i=0−n) in the flash memory card of this embodiment will be described below with reference to the timing chart of FIG. 5. Note that one-page data is generally written in each flash memory in one write cycle TW.

The controller 10 holds the chip enable control signal XFCEi- at active level (L level) throughout the write cycle TW in the flash memory FMi to keep the flash memory FMi in the chip enable state.

First of all, the controller 10 sets the command latch enable control signal FCLE in the active state (H level) to send a data input command CMS including a predetermined code onto the bus FD0-7, and at the same time, sets the write enable control signal XFWE- in the active state (L level). The flash memory FMi receives the data input command CMS on the bus FD0-7, and latch it in the command register 50 in response to a command write operation performed by the controller 10.

Subsequently, the controller 10 sets the address latch enable control signal FALE in the active state (H level) to output a write address ADW including a predetermined number of bits onto the bus FD0-7 in one to three cycles. Every time this output operation is performed, the write enable control signal XFWE- is set in the active state (L level).

In response to the address write operation performed by the controller 10, the flash memory FMi receives the write address ADW on the bus FD0-7, and latches it in the address buffers 52 and 54. This write address ADW designates a page in the flash memories FMi in which the data is to be written.

Keeping the command latch enable control signal FCLE and the address latch enable control signal FALE in the inactive state (L level), the controller 10 outputs write data DATAW corresponding to one page (528 bytes) onto the bus FD0-7 in units of one byte. Every time this output operation is performed, the write enable control signal XFWE- is set in the active state (L level). In response to the write enable control signal XFWE-, the flash memory FMi receives the write data DATAW on the bus FD0-7 in units of one byte, and stores the data in the I/O buffer 46.

The controller 10 sets the command latch enable control signal FCLE in the active state (H level) again to output a program command CMP including a predetermined code onto the bus FD0-7, and at the same time, sets the write enable control signal XFWE- in the active state (L level). In response to the command write operation performed by the controller 10, the flash memory FMi receives the program command CMP on the bus FD0-7 and starts a programming operation.

More specifically, the flash memory FMi decodes the program command CMP, and writes the one-page (528 bytes) data, stored in the command processor 26, in a storage area (page) in the flash memory array 40 which is designated by the write address ADW. This data write operation in the memory requires a predetermined time tWB, e.g., about 300 ms. At the start of this data write operation, the flash memory FMi sets the busy signal XFBSY- in the active state (L level), and holds this busy state until the data write operation is complete (after the lapse of the predetermined time tWB).

When the busy time tWB for the data write operation in the flash memory FMi has elapsed, the controller 10 checks whether the busy signal XFBSY- has returned to the inactive state (H level), and checks whether this data write operation (programming) in the flash memory FMi has been properly performed.

In order to check this programming result, the controller 10 sets the command latch enable control signal FCLE in the active state (H level) to output a status register read command CMC including a predetermined code onto the bus FD0-7, and at the same time, sets the write enable control signal XFWE- in the active state (L level).

In response to the command write operation performed by the controller 10, the flash memory FMi receives the status register read command CMC from the bus FD0-7, decodes the command CMC, and responds to the command CMC. That is, a write status bit I/O0 set in the status register in the command register 50 in the flash memory FMi is output onto the bus FD0-7 through the I/O buffer 46.

The controller 10 sets the read (output) enable control signal XFRE- in the active state (L level) to receive the write status bit I/O0 from the flash memory FMi, and checks on the basis of the bit contents whether the data write operation (programming) in this write cycle TW has been properly performed.

An operation to be performed when the controller 10 reads out one-page data from an arbitrary flash memory FMi in the flash memory card of this embodiment will be described next with reference to the timing chart of FIG. 6.

The controller 10 holds the chip enable control signal XFCEi- in the active state (L level) to keep the flash memory FMi in the chip enable state (operable state) throughout a read cycle TR.

First of all, the controller 10 sets the command latch enable control signal FCLE in the active state (H level) to output a read command CMR including a predetermined code onto the bus FD0-7, and at the same time, sets the write enable control signal XFWE- in the active state (L level). In response to the command write operation performed by the controller 10, the flash memory FMi receives the read command CMR from the bus FD0-7, and latches it in the command register 50.

Subsequently, the controller 10 sets the address latch enable control signal FALE in the active state (H level) to output a read address ADR of a predetermined number of bits onto the bus FD0-7 in one to three cycles. Every time this output operation is performed, the controller 10 sets the write enable control signal XFWE- in the active state (L level).

In response to the address write operation performed by the controller 10, the flash memory FMi receives the read address ADR on the bus FD0-7, and starts a data read operation in the memory.

More specifically, the flash memory FMi decodes the input read command CMR and the input read address ADR, reads out one-page (528 bytes) data DATAR from a storage area (page) in the flash memory array 40 which is designated by the read address ADR, and transfers (sets) the readout data DATAR to the 1/0 buffer 46. Since this read operation in the memory requires a predetermined time tRB, e.g., about 25 ms, the flash memory FMi holds the busy signal XFBSY- in the active state (L level) for this processing time tRB.

When the read operation in the flash memory FMi is complete, and the busy state is canceled (the busy signal XFBSY- returns to H level), the controller 10 starts to load the readout data DATAR set in the I/O buffer 46 of the flash memory FMi (7). More specifically, the controller 10 loads the one-page (528 bytes) readout data DATAR from the I/O buffer 46 of the flash memory FMi in units of one byte by repeatedly setting (528 times) the read (output) enable control signal XFRE in the active state (L level) at predetermined periods.

FIG. 7 shows an example of the format of CIS information (part). The attribute information shown in FIG. 7 is mainly associated with the configuration of the card, but also includes attribute information associated with an address scheme, such as a memory address length, an I/O address range, and interruption condition information. For example, the overall CIS information has an information amount of 128 bytes.

An operation to be performed to write CIS information in the flash memory card of this embodiment will be described next.

A CIS information write operation is executed by the controller 10 in accordance with a predetermined command supplied from the host computer 14 and desired CIS information. Processing to be performed by the controller 10 to write the first CIS information will be described first with reference to the flow chart of FIG. 8.

The controller 10 selects the head page PG0 of the head block BL0 of the first flash memory FM0 as defaults, and reads out data from the page PG0 of the head block BL0 in the above read cycle (FIG. 6) (steps A1 and A2).

The controller 10 then refers to the block quality flag contained in the block status information of the redundant portion of the readout information to check whether the head block BL0 is non-defective or not (step A3). If it is determined that the head block BL0 is defective, the controller 10 reads out data from the head page PG0 of the second block BL1 of the first flash memory FM0 (steps A4 and A2), and checks on the basis of the block quality flag whether the block BL1 is non-defective or not (step A3). In this manner, the controller 10 detects a non-defective block BLj having the highest address rank (the smallest address value) in the first flash memory FM0.

The controller 10 then writes the CIS information in the head page PG0 of the detected non-defective block BLj having the highest address rank in the above write cycle (FIG. 5) (step A5).

In this embodiment, in order to improve the security of the CIS information, the CIS information is copied in the flash/controller interface 34 to prepare two pieces of identical CIS information, and the two pieces of identical CIS information (128 bytes) are doubly written in the front and rear half portions (each having a capacity of 256 bytes) of the data area on the head page PG0 of the block BLj in which the CIS information is to be written.

Processing to be performed by the controller 10 to rewrite (update) CIS information.

In a rewrite operation as well, the controller 10 starts a search from the head page PG0 of the head block BL0 of the first flash memory FM0 as defaults, and detects the non-defective block BLj having the highest address rank in the first flash memory FM0 on the basis of the block quality flag contained in the block status of the redundant portion (steps B1 to B4).

The CIS information is stored in the head page PG0 of this detected block BLj. In this case, the controller 10 checks the error flag contained in the data status of the redundant portion of the head page PG0 (step B5).

The first (first version) CIS information serves as the current CIS information until the first rewrite operation is complete. Therefore, the error flat is not set in the head page PG0. Upon checking this point, the controller 10 updates the page and determines the next (second) page PG1 of the block BLj as a page in which the second version of CIS information is to be written (B6).

In other words, the controller 10 confirms the state of the error flag of the pages sequentially from the head page, determines the page that the error flag is not set as the page containing the current CIS information, and decides the page next to the page determined as destination into which the second version CIS information is to be written.

The controller 10 checks on the basis of a command from the host computer 14 whether part or all of the CIS information is to be rewritten (updated) by this rewrite operation (step B7). If it is determined that all the CIS information is to be updated, the CIS information (all) received from the host computer 14 is determined as the second version of CIS information. If part of the information is to be updated, the target portion (to be updated) of the current (first version) CIS information read out from the head page PG0 is replaced with the CIS information (part) received from the host computer 14 in the flash/controller interface 34, thus updating the CIS information (step B8). This updated CIS information is determined as the second version of CIS information.

The controller 10 writes this second version of CIS information in the second page PG1 in the block BLj in the above write cycle (FIG. 5) (step B9). The first rewrite operation for the CIS information is complete in this manner. Note that the first version of CIS information is left as the old CIS information in the head page PG0. Subsequently, the controller 10 performs post-processing, i.e., setting the error flag in the data status of the redundant portion of the head page PG0, to inhibit reference to this old CIS information.

In the second rewrite operation, the head page PG0 of the block BLj is accessed first. However, since the error flag is set in this head page PG0, data is read out from the second page PG1 (steps B2, B3, and B6). Thereafter, the same processing as in the first rewrite operation is performed (steps B7 to B9). In this operation, the third version of CIS information is doubly written in the front and rear half portions of the third page PG2. Setting of the error flag in the second page PG2 is then performed as post-processing. The third and subsequent rewrite operations are performed in the same manner as described above.

Figure 10:
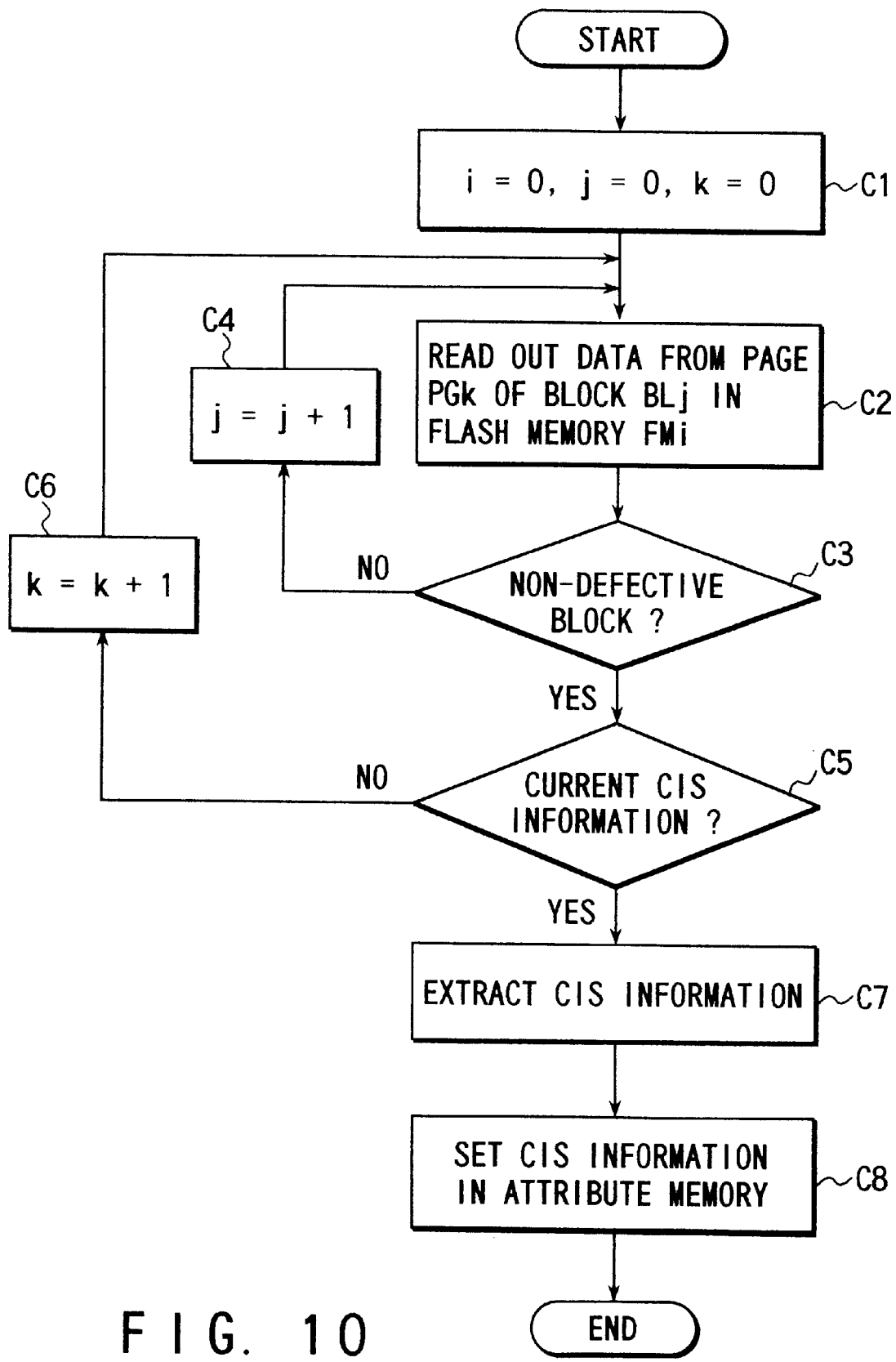
FIG. 10 is a flow chart showing processing to be performed by the controller to present the CIS information of the flash memory card in accordance with a request from the host computer.

Processing to be performed by the controller 10 to present the CIS information of this flash memory card in accordance with a request from the host computer 14 will be described next with reference to the flow chart of FIG. 10.

In this case, the controller 10 performs a search in the same manner as in the above CIS information rewrite processing to detect a page PGk which belongs to the non-defective block BLj having the highest address rank in the first flash memory FM0 and in which the current CIS information is stored (steps C1 to C6).

The controller 10 selects or extracts one of the two pieces of CIS information read out from the front and rear half portions of the detected page PGk, e.g., the information from which a normal check result is obtained after a parity check (step C7). The controller 10 sets this extracted current CIS information in a predetermined memory or register (e.g., an attribute memory) in the host/controller interface 20 (step C8), and presents the information to the host computer 14.

As described above, in the flash memory card of this embodiment, CIS information is stored at a predetermined storage position in a predetermined flash memory, and can be rewritten as needed. The controller 10 mounted on this card performs overall management for CIS information write, rewrite, and read operations in the card under a predetermined rule, i.e., "the current CIS information should be stored in a page having the highest address rank which belongs to the non-defective block having the highest address rank in the first flash memory FM0 and in which the error bit is not set in the data status of the redundant portion".

In this embodiment, since a flash memory is used to hold CIS information in this manner, no special nonvolatile memory and terminal for CIS information need be added. In addition, the host computer 14 can arbitrarily rewrite the CIS information of the flash memory card.

Note that the above rule is an example, and can be variously modified. For example, the block or page in which CIS information is to be stored can be determined in the ascending address order instead of the descending address order.

The write protect function of the flash memory card of this embodiment will be described next.

As shown in FIG. 1, the write protect circuit 13 is mounted on this flash memory card. FIG. 11 shows an example of the arrangement of the write protect circuit 13. FIG. 12 shows examples of the switch member and display member of the write protect circuit 13 which are mounted on the outer side surface of the card.

Referring to FIG. 11, the write protect circuit 13 includes a load resistor 70 and a manual switch 72 which are connected in series with each other between the terminal of an intra-card power supply voltage VB and the ground potential, and is designed to output the write protect signal WPIN from a node N between these components.

When the flash memory card is inserted into the card slot of the host computer 14, the power supply voltage VB is applied from the host computer 14 to the card. When the switch 72 is open, the potential at the node N goes to H level at the leading edge of the power supply voltage VB in this card. As a result, the write protect signal WPIN in the active state (H level) is supplied to the controller 10. When the switch 72 is closed, the potential at the node N remains at L level even at the leading edge of the power supply voltage VB. The write protect signal WPIN is therefore held in the inactive state (L level).

A series circuit of an inverter 74 and a light emitting diode 76 and a series circuit of two inverters 78 and 80 and a light emitting diode 90 are connected between the node N and the ground potential. When the write protect signal WPIN is in the active state (H level), the light emitting diode 90 is turned on to emit light LR of a color (e.g., red) indicating the write disabled state. When the write protect signal WPIN is in the inactive state (L level), the light emitting diode 76 is turned on to emit light LG of a color (e.g., green) indicating the write enabled state.

As shown in FIG. 12, a slide type knob may be mounted as the operating portion (movable contact) of the manual switch 72 on one surface of the card plate 12. In addition, the two light emitting diodes 76 and 90 may be mounted on a card end portion on the opposite side to a card terminal pin 92 to allow the user to visually recognize the ON states of the diodes while the card is inserted into the card slot of the host computer 14.

As described above, in this embodiment, write protection is applied to the controller 10 electrically or by means of software (with the write protect signal WPIN) by the write protect circuit 13 within the card in accordance with the manual operation of the manual switch 72 mounted on the card plate 12.

Note that the arrangement shown in FIGS. 11 and 12 is only an example, and can be variously modified. For example, instead of the manual switch 72, a photosensor for detecting the presence/absence of a lightproof seal which can be stuck/peeled at/from a predetermined position on the card plate 12 can be incorporated in the card plate 12. In this case, when the lightproof seal is stuck at the predetermined position on the card plate 12, the photosensor in the card detects the seal, and a circuit corresponding to the write protect circuit 13 outputs the active write protect signal WPIN. Furthermore, the card may have a mark (e.g., an opening/closing window) indicating whether the user intends to apply write protection to the card or not, and a sensor (e.g., a photosensor) for detecting the state of the mark on the card, a write protect circuit, state indicating lamps (76, 90), and the like may be arranged on the host computer 14 side, i.e., near the card slot.

When the above write protection is applied to this flash memory card, the controller 10 returns an abort (request reject) signal in response to a write request (command) from the host computer 14, and performs no write operation.

In the card, all the flash memories FM0 to FMn can be set in the write disable state through, e.g., the write protect control line XFWP. If, however, all the memories are set in the write disable state, some inconvenience may occur in a read operation.

In the flash memory card of this embodiment, when a data read operation is performed, the flash/controller interface 34 in the controller 10 detects an ECC error. When an ECC error is detected, the readout data is conditionally corrected, and the corrected data is transferred to another storage position. If all write operations are inhibited by write protection, this data transfer cannot be performed.

For this reason, the write protect function in this embodiment is designed to exceptionally allow data transfer inside a flash memory or between flash memories even in the write disable state.

In the above ECC error processing, an available block BLh in a flash memory adjacent to the flash memory in which the error has occurred is selected as the destination of the corrected data. In addition to the data in the page PGk in which the ECC error has occurred, the data in all the remaining pages PG0 to PGK-1 and PGK+1 to PG15 in the same block BLj are transferred to the corresponding pages in the available block BLh.

In transferring this one-block data, first of all, the controller 10 reads out one-page data from the block BLj, from which the data is to be transferred, in the above read cycle (FIG. 6), and temporarily holds the data in the buffer memory in the flash/controller interface 34. The controller 10 then writes the data in the corresponding page of the available block BLh in the above write cycle (FIG. 5). This one-page data transfer operation is repeated for all the pages PG0 to PG15, while the data in the page PGk in which the ECC error has occurred is corrected in the flash/controller interface 34 in the process of transferring the data.

As described above, since the flash memory card of this embodiment itself has the write protect function, important data stored in the card can be protected against an undesired write request from the host computer 14.

Figure 13:
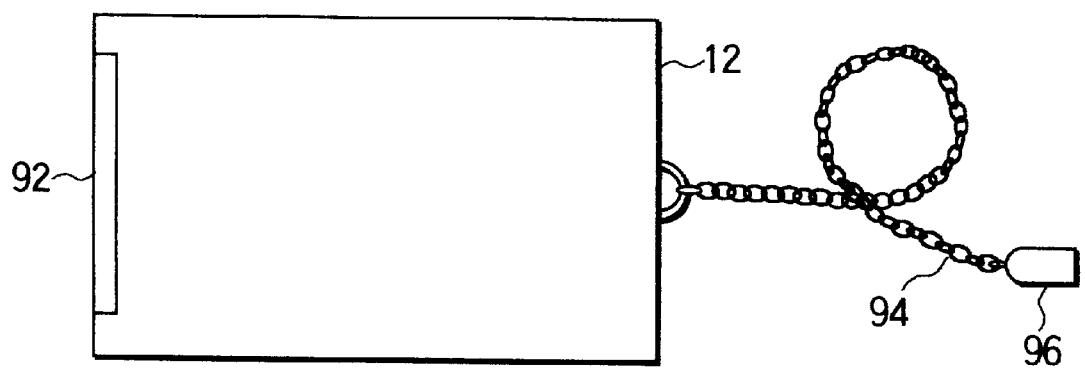
FIG. 13 is a schematic plan view showing a holding member suitable for the flash memory card of the embodiment.
Figure 14A:
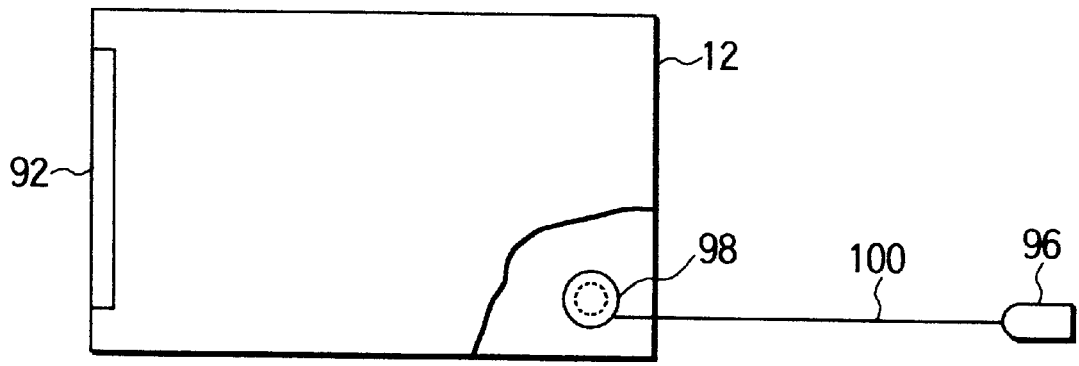
FIGS. 14A and 14B are schematic plan views showing another holding member suitable for the flash memory card of the embodiment.
Figure 14B:
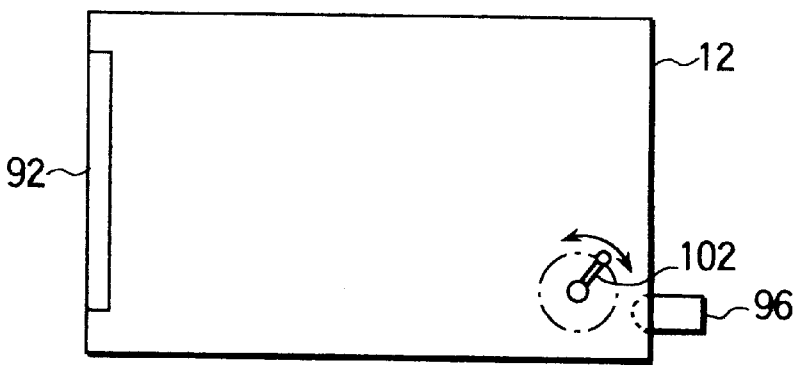

FIGS. 13 to 14B show examples of the holding member suitable for the flash memory card of this embodiment. In the example shown in FIG. 13, a chain 94 is preferably connected to a card end portion on the opposite side to the card terminal pin 92, and a lock member, e.g., a clip 96, is attached to the distal end of the chain 94. When, for example, this card is kept in the breast pocket of a shirt, the clip 96 is locked to the upper edge portion of the pocket to prevent the card from being lost even if it accidentally falls out of the pocket.

In the example shown in FIGS. 14A and 14B, a thin string 100 is connected to a reel 98 incorporated in the card plate 12 so as to be wound around the reel (FIG. 14A), and a lock member, e.g., a clip 96, is attached to the distal end of the thin string 100. A thin string take-up knob 102 coupled to the reel 98 may be rotatably mounted on the outer side surface of the card plate 12 (FIG. 14B). The clip 96 may be partly housed in the card plate 12 while the thin string 100 is completely wound (FIG. 14B), or may be formed to be on a level with the card plate 12 so as not to become a hindrance.

The above flash memory card is generally provided as a PC card complying with PCMCIA. However, the present invention can be applied to a flash memory card in an arbitrary form, e.g., a flash memory card on which an SSFDC (Solid State Floppy Disk Card) is detachably mounted.

An SSFDC is a compact single card incorporating one-chip flash memory FM. A controller corresponding to the controller 10 in the above embodiment is incorporated in an adapter card which can be inserted (connected) into a card slot complying with PCMCIA, and the SSFDC is detachably mounted on this adapter card, thus a flash memory card complying with PCMCIA can be obtained in the following manner.

For example, the flash memory card 112 shown in FIG. 15A comprises an adapter 120 mounted on a host computer 114 and a flash memory unit 121 detachably mounted on the adapter 120. The adapter 120 has a controller 110 connected to the host computer 114 for controlling the flash memories FM0–FMn.

A flash memory card shown in FIG. 15B comprises an adapter 130 having no controller and a flash memory unit 121 detachably mounted on the adapter 130.

The SSFDC described above may be used as an external memory medium for a digital still camera. The SSFDC is loaded into the digital still camera instead of a film, and electrophotographic information (image information) is recorded on the SSFDC. The SSFDC having undergone a recording process is taken out from the camera and loaded into the adapter card described above. This card is then inserted as a flash memory card complying with PCMCIA into the card slot of the host computer (personal computer) 14 to reproduce the electrophotographic information on the screen of the host computer 14, process the information by using retouch software or the like, or add desired additional information and the like to the information.

In using the SSFDC in this manner, compatibility between the digital still camera and the host computer 14 is required. According to the present invention, the CIS information of the camera specifications can be written in the SSFDC in advance in the same manner as in the above embodiment. When a flash memory card on which this SSFDC is attached or mounted is inserted into the card slot of the host computer 14, the host computer 14 can search for or refers to the CIS information of the SSFDC from the flash memory card in the same manner as in the above embodiment. The host computer 14 can check the compatibility with the SSFDC or the digital still camera, which has recorded electrophotographic information on the SSFDC, in the early stage, on the basis of the CIS information.

As has been described above, according to the flash memory card of the present invention, since card attribute information is stored in a flash memory on the card, the card attribute information can be arbitrarily rewritten without increasing the number of parts and the cost. In addition, since the card itself has the write protect function, data stored in the card can be reliably protected against an undesired request from the host computer side. Furthermore, a flash memory card in which a flash memory unit is detachably mounted on an adapter is not required to rewrite CIS information in accordance with the type of the mounted flash memory unit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A flash memory card including CIS information and that is constructed and arranged to conform with a PC card standard, comprising:
   at least one flash memory; and
   a controller having an interface connectable to a host computer to store the CIS information to be presented to said host computer at a predetermined storage position in said at least one flash memory, said controller having a function for storing new CIS information and an effective flag in a page of a next address in accordance with a command supplied from the host computer every time at least some of the CIS information are changed.

2. The flash memory card according to claim 1, wherein information identical to the CIS information is stored at a storage position, in said flash memory, which is different from the storage position at which the CIS information is to be stored.

3. The flash memory card according to claim 1, wherein said flash memory has a storage area divided into a predetermined number of blocks, and the CIS information is stored in a normal block having a highest or lowest address rank in said flash memory in which the CIS information is to be stored.

4. The flash memory card according to claim 1, wherein said flash memory has a storage area divided into a predetermined number of blocks, each of which is divided into a plurality of page areas including a head page area for storing the CIS information to be presented to said host computer, each of the page areas having a data area for storing data from said host computer and a redundant portion for storing control information.

5. The flash memory card according to claim 4, wherein the redundant portion includes a portion for storing the CIS information representing configuration of the card and an access scheme by which the card is accessed.

6. The flash memory card according to claim 5, wherein the redundant portion includes a portion for storing information representing a memory address length, an I/O address range and an interruption condition as the CIS information indicating the access scheme.

7. The flash memory card according to claim 4, wherein said controller has a function for storing information identical to the CIS information at a storage position different from that in said flash memory at which the CIS information is to be stored.

8. The flash memory card according to claim 4, wherein said controller has a function for storing information identical to the CIS information at a storage position different from that in said flash memory at which the CIS information is to be stored.

9. The flash memory card according to claim 1, wherein said controller has a function for storing information identical to the CIS information at a storage position different from that in said flash memory at which the CIS information is to be stored.

10. The flash memory card according to claim 1, further comprising a flash memory unit in which the at least one flash memory is received, and an adapter in which the controller is received and which is detachably mounted on said flash memory unit.

11. A flash memory card according to claim 1, further comprising:
   a flash memory unit in which said at least one flash memory is received; and
   an adapter connectable to the host computer and detachably mounted on said flash memory unit.

12. The flash memory card according to claim 1, wherein every time the CIS information is changed, said controller sets an invalid flag in a recording area corresponding to the old CIS information.

13. A flash memory card comprising:
   at least one flash memory having a storage area divided into a predetermined number of blocks, each of which is divided into a plurality of page areas including a head page area for storing CIS information to be presented to a host computer, each of the page areas having a data area for storing data from said host computer and a redundant portion for storing control information; and
   a controller having an interface connected to a host computer to store CIS information to be presented to said host computer at a predetermined storage position in said at least one flash memory, said controller having a function to execute a series of processes in accordance with a command supplied from the host computer, the processes including selecting a head page of a head block from the predetermined number of blocks, determining quality of a block from a block quality flag of the redundant portion of the head block, extracting a good quality block having a highest or lowest order address among addresses of said flash memory, and storing the CIS information in the head page of the extracted good quality block.

14. The flash memory card according to claim 13, wherein said controller has a function for storing the CIS information representing configuration of the card and an access scheme by which the card is accessed in the redundant portion.

15. The flash memory card according to claim 14, wherein said controller has a function for storing information representing a memory address length, an I/O address range and an interruption condition as the CIS information indicating the access scheme in the redundant portion.

16. The flash memory card according to claim 13, wherein said controller has a function for storing new attribute information in a page of a next address every time at least some of the CIS information are changed.

17. The flash memory card according to claim 13, wherein every time the CIS information is changed, said controller sets an invalid flag in a recording area corresponding to the old CIS information.

18. The flash memory card according to claim 13, further comprising a flash memory unit in which the at least one flash memory is received, and an adapter in which the controller connected to the host computer is received and which is detachably mounted on said flash memory unit.

19. A flash memory card according to claim 13, further 13, comprising:

a flash memory unit receiving said at least one flash memory; and an adapter connected to the host computer and detachably mounted on said flash memory unit.

* * * * *